United States Patent [19]

Noe et al.

[11] Patent Number: 5,657,208
[45] Date of Patent: Aug. 12, 1997

[54] SURFACE MOUNT ATTACHMENTS OF DAUGHTERBOARDS TO MOTHERBOARDS

[75] Inventors: Terry Noe, Santa Rosa; Leonard Weber, Windsor, both of Calif.

[73] Assignee: Hewlett-Packard Company, Palo Alto, Calif.

[21] Appl. No.: 508,731

[22] Filed: Jul. 28, 1995

[51] Int. Cl.⁶ ........................................... H05K 1/14
[52] U.S. Cl. ................... 361/790; 361/760; 361/803; 361/784; 361/779; 439/91
[58] Field of Search ........................ 361/784, 743, 361/744, 745, 790, 774, 771, 779, 803, 760; 439/91

[56] References Cited

U.S. PATENT DOCUMENTS 5,477,933  12/1995  Nguyen ..................................... 174/262
5,572,405  11/1996  Wilson et al. ............................. 361/705

Primary Examiner—Leo P. Picard
Assistant Examiner—David Foster
Attorney, Agent, or Firm—Pamela Lau Kee

[57] ABSTRACT

A hybrid printed circuit board comprising two substrates having different thermal coefficients of expansion can be manufactured using automated surface mount techniques. A daughterboard is configured with a number of contact pads on the bottom. A motherboard is configured with an aligned set of contact pads on the top with solder compound stenciled on them. The daughterboard is attached to the motherboard using standard automated surface mount techniques.

3 Claims, 6 Drawing Sheets

SURFACE MOUNT ATTACHMENTS OF DAUGHTERBOARDS TO MOTHERBOARDS

FIELD OF THE INVENTION

The present invention is related to printed circuit board design and manufacturing, in particular reliably interconnecting circuits implemented on printed circuit board substrates having different thermal coefficients of expansion.

BACKGROUND OF THE INVENTION

For most RF and microwave circuits, only a portion needs to be implemented on a high performance printed circuit board substrate. These high performance substrates are expensive and difficult to process. For economic reasons, board designers prefer to implement as much of the circuit as practical on an inexpensive, easy-to-process substrate and use the high performance substrates only where needed to achieve RF or microwave operation.

As shown in FIG. 1, in one prior art example, the inexpensive substrate, or motherboard 1, has a hole 2 that is slightly larger in area than the high performance substrate, or daughterboard 3. The daughterboard 3 is seated within the hole 2, and the boards 1 and 3 are clamped together with a cast metal shield 4. Signals are routed from one to another with axial lead capacitors 5 which are soldered between the boards 1 and 3. This is not a cost-effective manufacturing process due to the need for the shield 4 and the manual labor required for assembly. The hole 2 also weakens the structural integrity of the motherboard 1. The characteristic impedance of the signal leads 5 is difficult to control. Furthermore, there is poor ground continuity between the motherboard 1 and the daughterboard 3.

FIG. 2 shows another prior art example in which solder paste 6 is manually applied to a motherboard 1 and a daughterboard 3 having substrates with matched thermal coefficients of expansion. In addition to increased manufacturing costs, the connections are prone to bridging because the solder is not shielded from overflow. Furthermore, self-registration of the daughterboard 3 to the motherboard 1 is not possible because there are no contact pads to aid alignment.

Moreover, the solder connections shown in FIG. 2 are provided primarily for ground plane and mechanical interconnection of the motherboard 1 and daughterboard 3. Consequently, these solder connections are few and large, and stress is concentrated at these solder connections. Therefore, if the motherboard 1 and daughterboard 3 were characterized by different thermal coefficients of expansion, the solder connections would be subject to failure when exposed to temperature variations. Accordingly, the prior art example shown in FIG. 2 is not readily susceptible to implementation of an RF or microwave circuit in which printed circuit board substrates having different thermal coefficients of expansion are used.

An efficient printed circuit board design methodology that promotes modular board design while accounting for the daughterboard as a design component is desirable. Also, any difference in the thermal coefficient of expansion for the substrate of the daughterboard with respect to the substrate of the motherboard should not affect the reliability of connections between the boards. The resulting board should also be easy and economical to manufacture.

SUMMARY OF THE INVENTION

A hybrid printed circuit board comprising two substrates having different thermal coefficients of expansion can be manufactured using automated surface mount techniques. A motherboard, consisting of an inexpensive material, is configured with a set of contact pads on its top surface. A daughterboard, having a corresponding pattern of contact pads on its bottom surface, is attached to the motherboard using standard automated surface mount techniques so that the contact pads on the daughterboard and motherboard are in proper registration.

The contact pads may be connected to signal traces. Alternatively, the contact pads on the motherboard can be connected to a ground plane contained within the motherboard. In addition to design flexibility, there is good ground continuity which improves the quality of interconnects. The characteristic impedance of the interconnects can be controlled by determining the size of stubs underlying the contact pads. This design methodology promotes modular design of printed circuit boards such that attaching different daughterboards customizes the functionality associated with the motherboard.

BRIEF DESCRIPTION OF THE DRAWINGS

FIG. 6, comprising

DETAILED DESCRIPTION OF THE PREFERRED EMBODIMENTS

Figure 3:
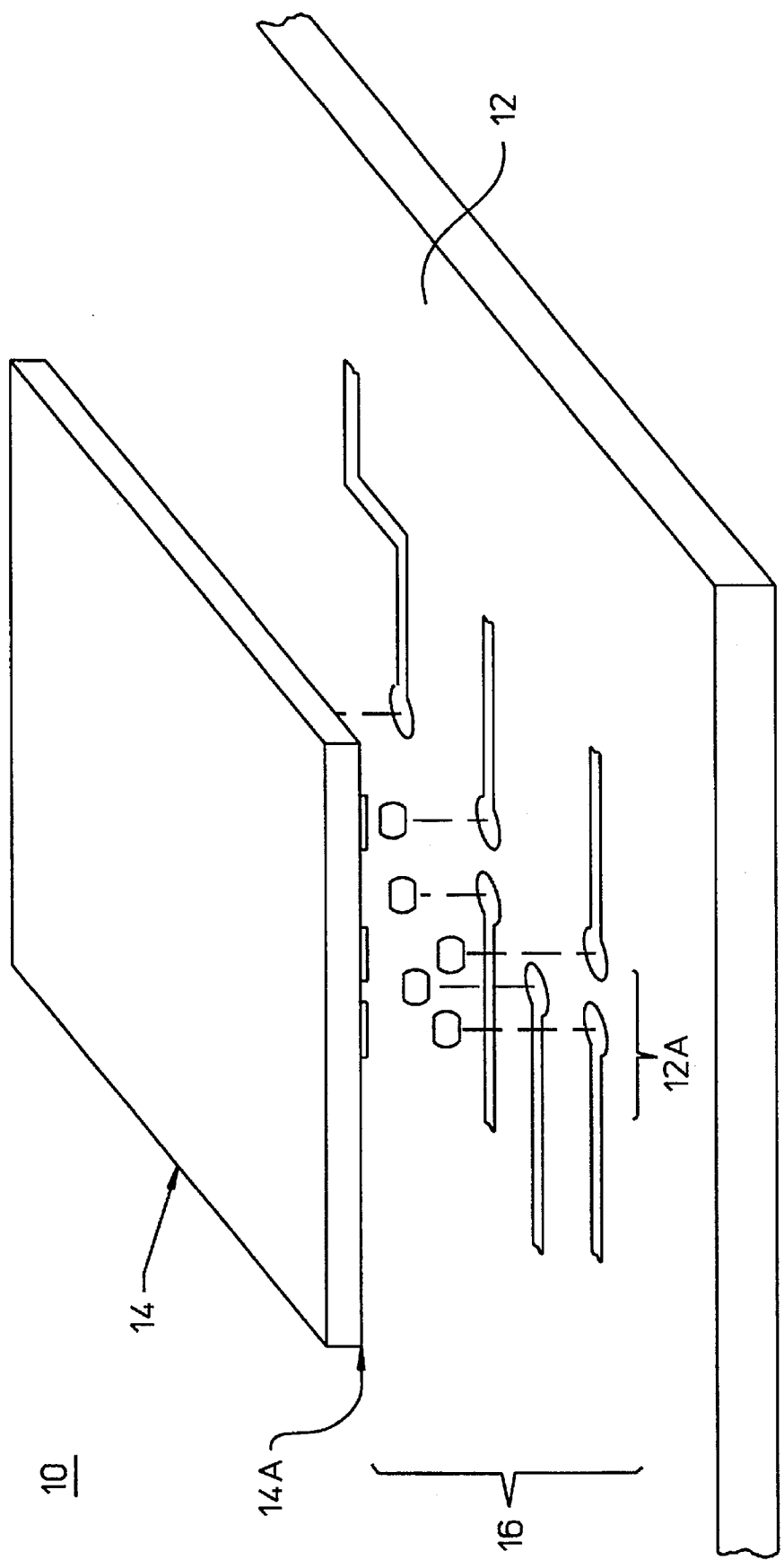
FIG. 3 shows an isometric view of a hybrid printed circuit board in accordance with one embodiment of the invention.

FIG. 3 shows a planar view of a hybrid printed circuit board 10 in accordance with one embodiment of the invention. A motherboard 12 has an array of contact pads 12A in a predetermined pattern on a top surface 12B. A daughterboard 14 has an array of contact pads 14A in the identical pattern on a bottom surface 14B. The daughterboard 14 can have passive or active components, such as a resistor 11A and amplifier 11B, mounted thereon. Solder compound 16 is preferably applied to the contact pads 12A on the motherboard 12. Alternatively, solder compound can be applied to the contact pads 14A on the daughterboard 14.

The motherboard 12 is typically an inexpensive printed circuit board material, such as a six-layer laminate of Getek manufactured by General Electric. When the substrate thickness of the motherboard 12 is 0.056" (0.142 cm), the associated thermal coefficient of expansion in the plane of the motherboard consisting of this material is 12–14 ppm/°C. The daughterboard 14 is formed of a high-performance substrate, such as Arlon CuClad 250. When the substrate of the daughterboard 14 is 0.060" (0.152 cm) thick, the associated thermal coefficient of expansion in the plane of the daughterboard consisting of this material is 9–10 ppm/°C. The first and second arrays of contact pads 12A, 14A are electrically conductive material, such as gold or copper traces plated with solder. The daughterboard 14 is attached to the motherboard 12 using standard automated surface mount techniques.

Figure 2:
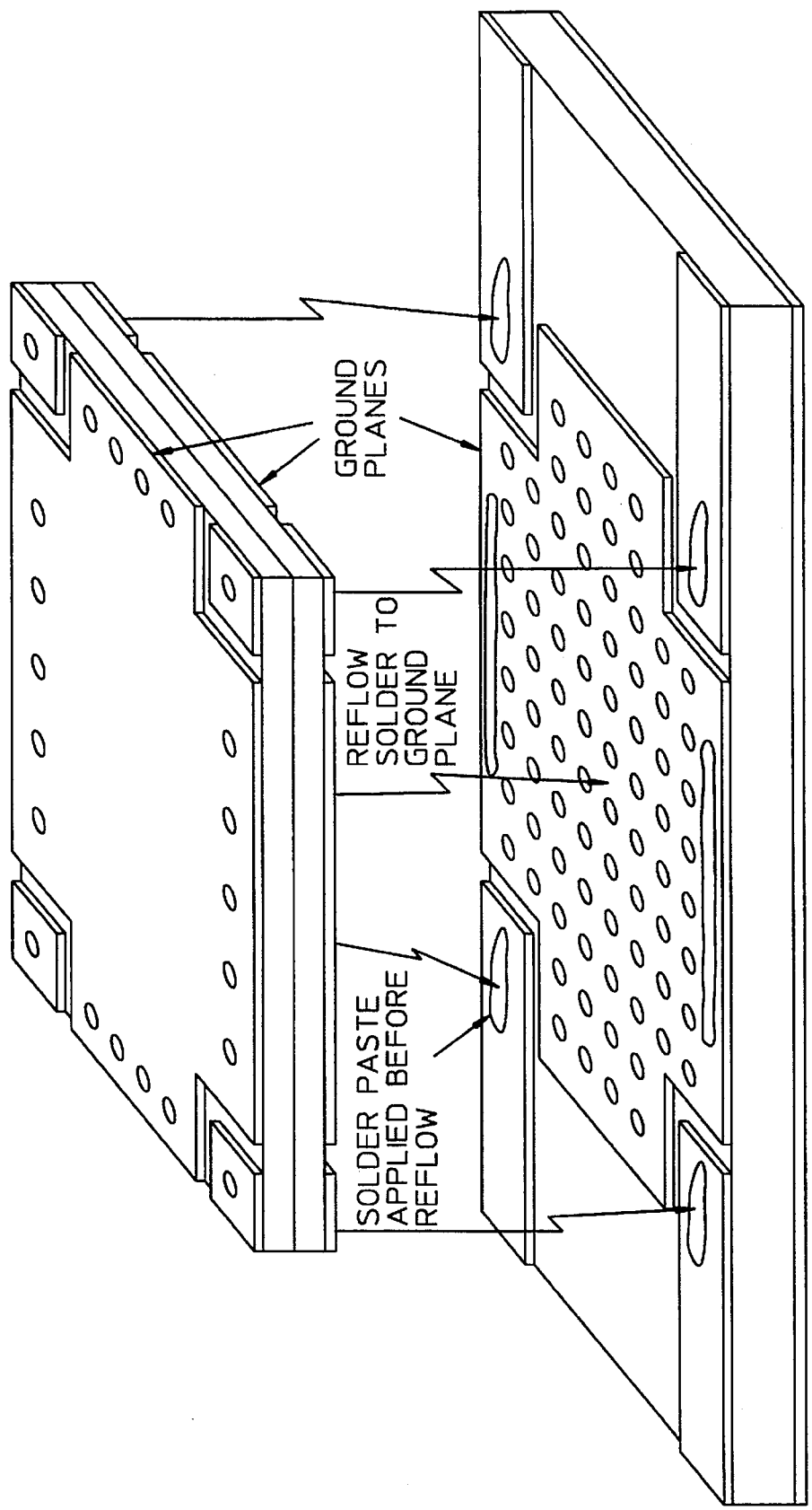
FIG. 2 illustrates a daughterboard connected along the perimeter to the motherboard (prior art).

In this embodiment, solder compound 16 is stenciled to the motherboard 12 for attachment of the daughterboard 14 and additional components (not shown). Next, the components and daughterboard 14 are loaded on to the motherboard 12 using a pick-and-place machine, such as a Fuji IP-II. The contact pads 14A of the daughterboard 14 align with the contact pads 12A of the motherboard 12 so that there is self-registration of the daughterboard to the motherboard. The solder compound 16 is then reflowed to ensure the attachment of the components and daughterboard 14 to the motherboard 12. Since there are a plurality of contact pads 12A, 14A in the predetermined pattern over the surface 12B of the motherboard 12 and the surface 14B of the daughterboard 14, stress forces due to the difference in thermal coefficients of expansion of the substrates of the motherboard and daughterboard are distributed over a number of solder connections spaced throughout the interface between the boards. This provides higher reliability than provided by the prior art example shown in FIG. 2.

The resulting hybrid printed circuit board 10 promotes an efficient modular printed circuit board design that accounts for the daughterboard 14 as a design component. The motherboard 12 may be designed flexibly such that the daughterboard 14 with the components 11A, 11B customizes the functionality associated with the motherboard. The resulting hybrid circuit board 10 is also easy to manufacture.

Figure 1:
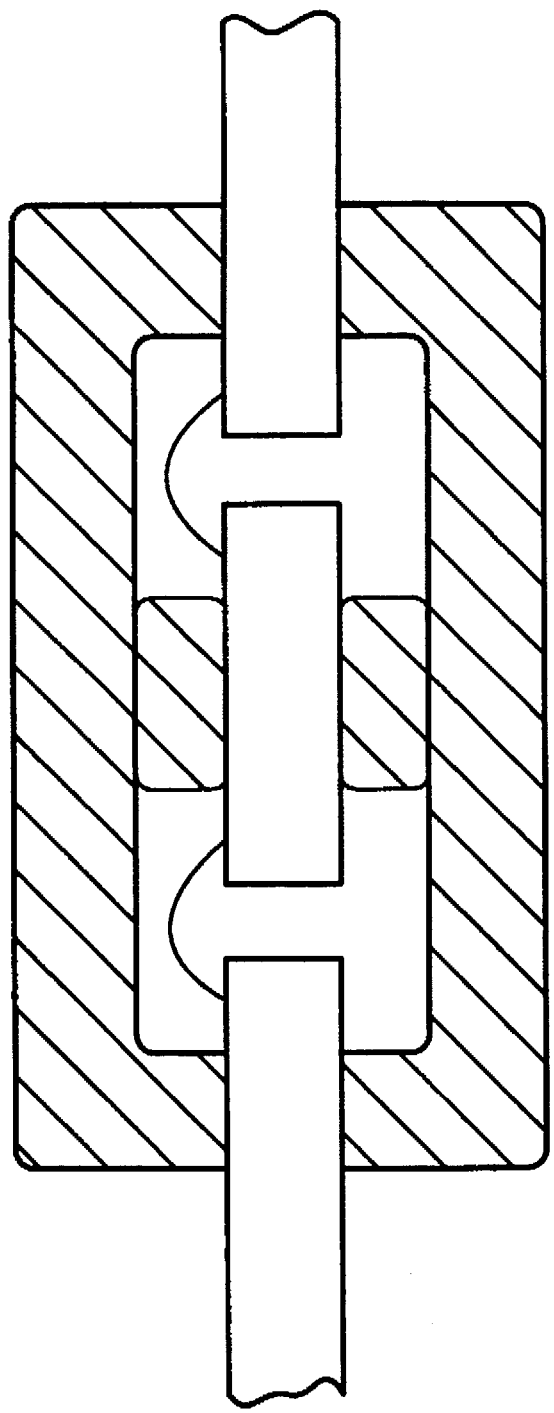
FIG. 1 illustrates a daughterboard positioned within a hole in a motherboard (prior art).
Figure 4:
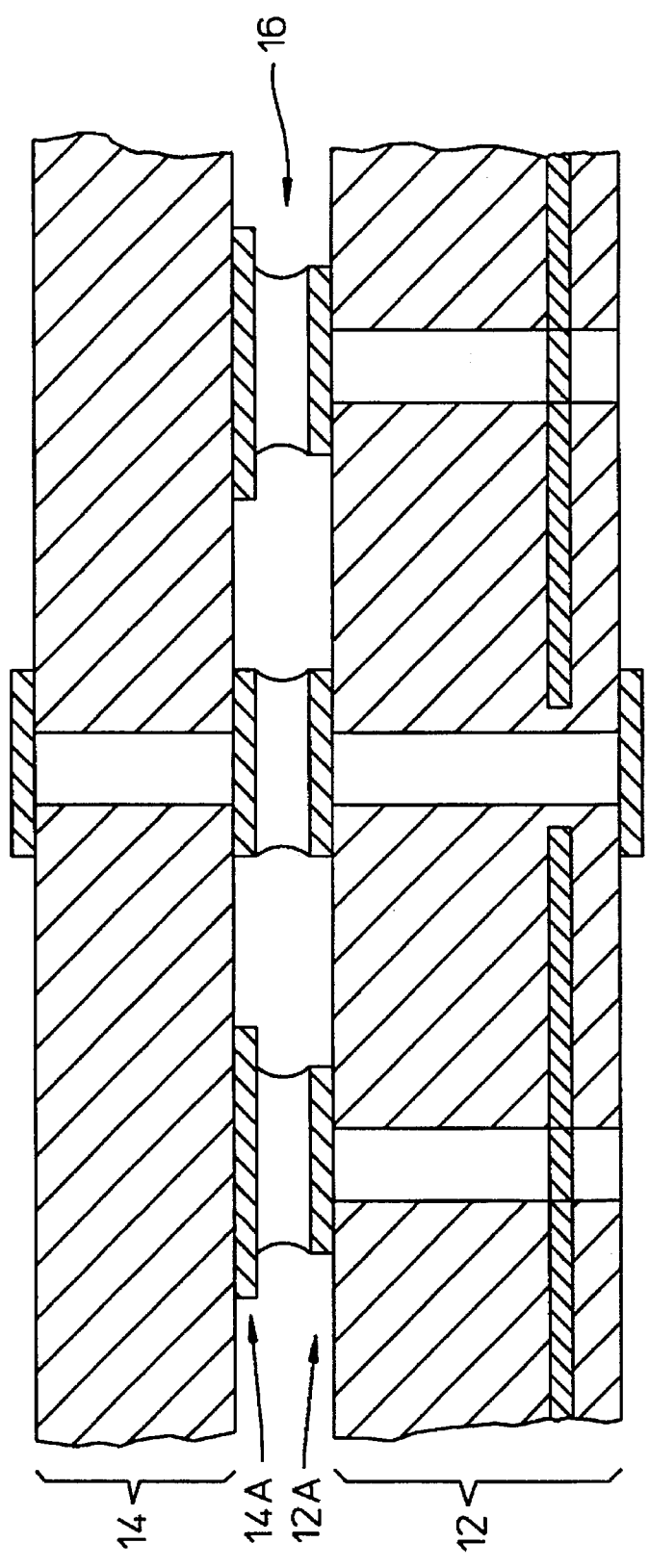
FIG. 4 illustrates a cross-sectional view of the hybrid printed circuit board shown in FIG. 3.

FIG. 4 illustrates a cross-sectional view of the hybrid printed circuit board 10. Contact pads 14A can be positioned anywhere on the bottom surface 14B of the daughterboard 14. The contact pads 12A, 14A of the motherboard 12 and daughterboard 14 may be connected to signal traces 13 or to a ground plane 15 contained within the motherboard. The components 11A, 11B shown in FIG. 1 are in turn connected to the signal traces 13 on the daughterboard 14. Electrical connections between the contact pads 12A, 14A and signal traces 13 and between the contact pads and the ground plane 15 are provided by interconnects 17. The interconnects 17 can be plated through-holes. In addition to design flexibility, there is good ground continuity which improves the quality of the interconnections by controlling the characteristic impedance of the interconnects 17. This design methodology promotes modular design of printed circuit boards such that attaching the daughterboard 14 customizes the functionality associated with the motherboard 12.

Figure 5:
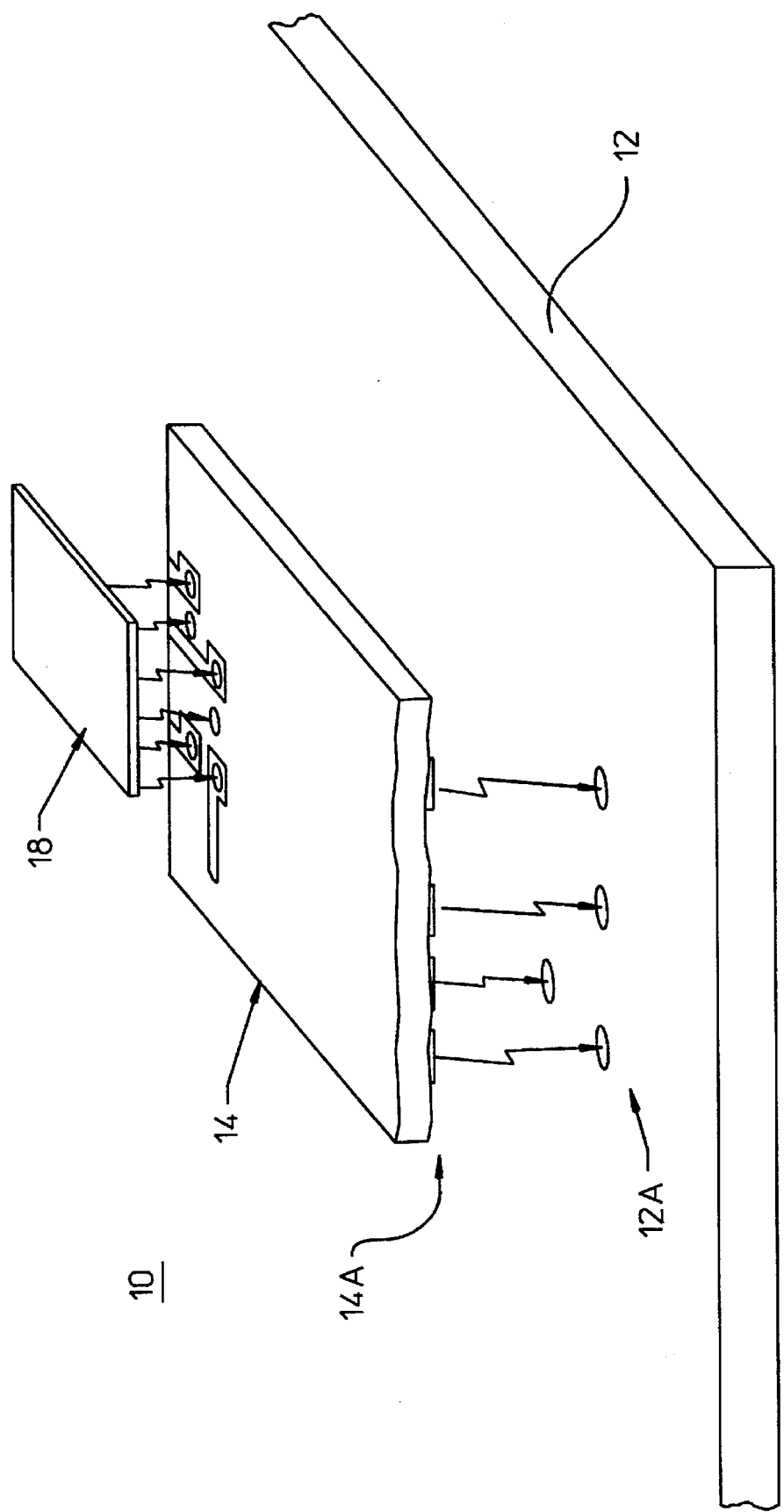
FIG. 5 shows an alternate embodiment of the hybrid printed circuit board in accordance with the invention.

FIG. 5 illustrates another embodiment of a hybrid printed circuit board 10'. An optional second daughterboard 18 or component (not shown) may be positioned on top of the daughterboard 14. The daughterboard 14 and the optional board 18 are attached using the solder compound and standard automated surface mount technique described earlier prior to the attachment of the daughterboard 14 to the motherboard 12.

Figure 6A:
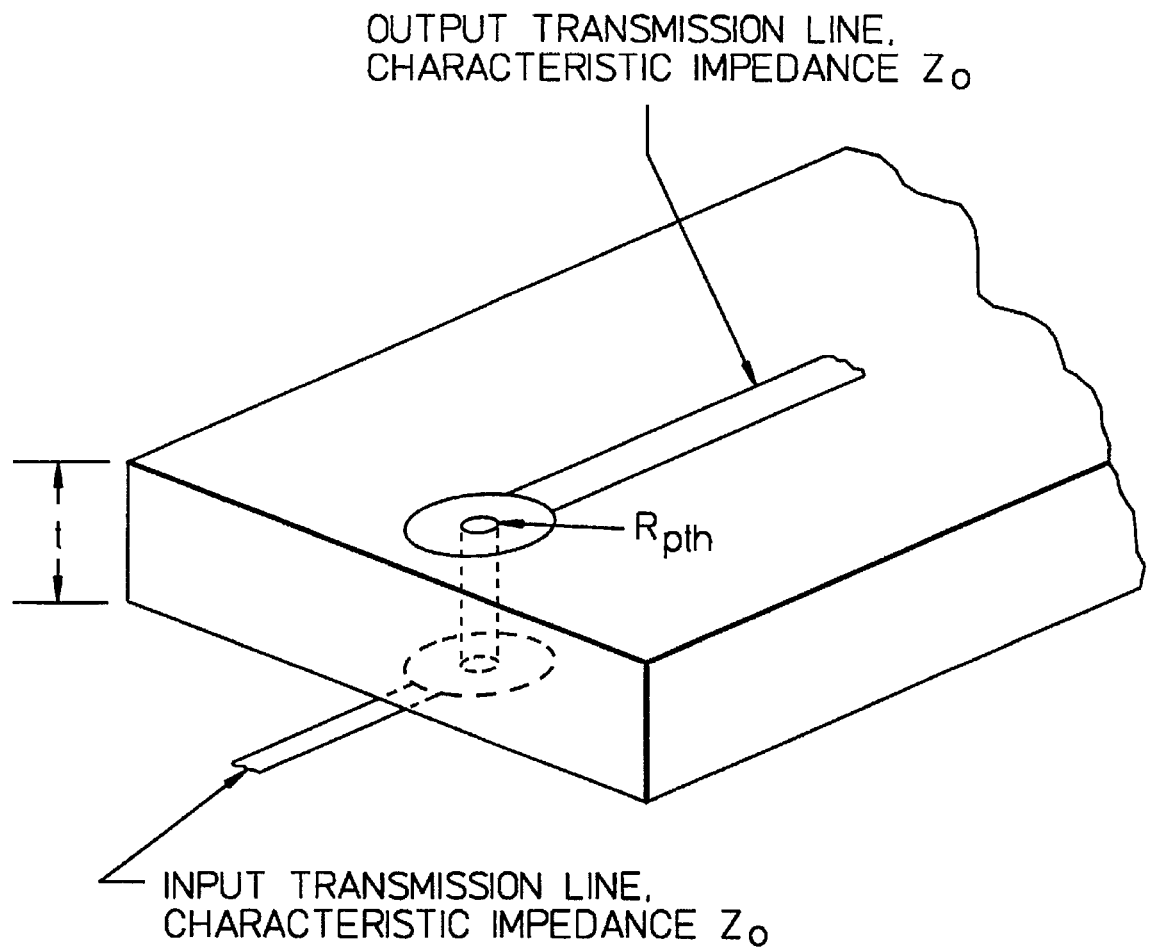
FIGS. 6A and 6B, shows an interconnect and the electrical circuit equivalent of the interconnect.
Figure 6B:
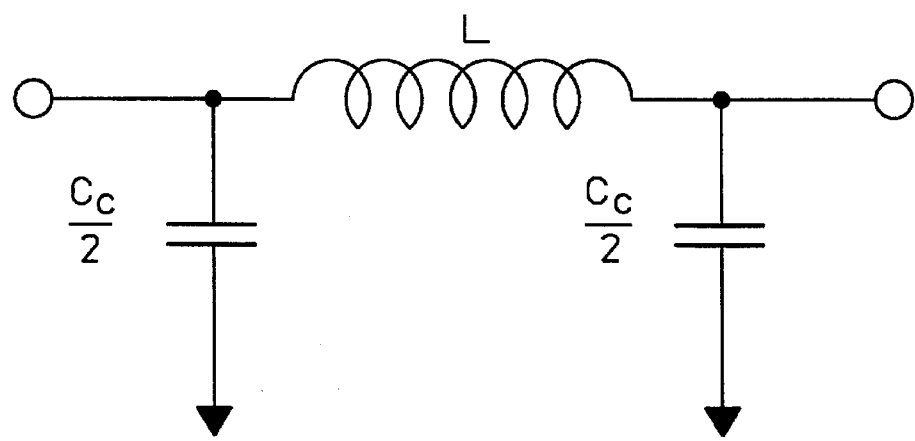

FIGS. 6A and 6B show a preferred interconnect 17 and an equivalent circuit model therefor. FIG. 6A is an illustration of the interconnect 17. FIG. 6B shows an electrical model for the interconnect 17. This model is used to determine the size of stubs 19A, 19B needed to control the impedance of the transition formed by the interconnect 17.

As shown in FIG. 6A, an output transmission line 20 on the daughterboard 14 is connected to an input transmission line 22 on the motherboard 12. In this example, the input and the output transmission lines 20, 22 have a characteristic impedance $Z_o$. Using Equation 1, the plated through-hole inductance, L, of the interconnect 17 is determined in microHenrys.

$$L = .002t \left[ \text{Log}_{10} \left( \frac{2t}{R_{pth}} \right) - 1 \right] \quad (1)$$

t is the thickness of the daughterboard 14 in centimeters. The daughterboard 14 also has a given dielectric constant dependent on the material from which the daughterboard is constructed. $R_{pth}$ is the plated through-hole radius in centimeters. In Equation 2, the capacitance required to compensate for L is determined.

$$C_c = \frac{L}{Z_o^2} \quad (2)$$

$Z_o$ is the desired characteristic impedance of the connection. $C_c$ is the capacitance necessary to compensate for the plated through-hole inductance.

The stubs 19A, 19B, such as copper patches, are added to the daughterboard 14 such that the capacitance of each is $C_c/2$. The stub 19B preferably underlies the contact pad 14A of the daughterboard 14. The size of the stubs 19A, 19B necessary to achieve this capacitance will depend on the board thickness t and dielectric constant of the daughterboard material. It can be calculated numerically or analytically, or determined from experiment.

We claim:

1. A hybrid printed circuit board having first and second thermal coefficients of expansion, comprising:

a mother board having the first thermal coefficient of expansion and having signal traces, wherein each signal trace terminates in a contact pad on a surface of the motherboard, the contact pads being arranged in a predetermined pattern on the surface of the motherboard;

a daughterboard having the second thermal coefficient of expansion and having signal interconnects, wherein each interconnect terminates in a contact pad on a surface of the daughterboard, the contact pads being arranged in the predetermined;

an array of solder compound, positioned between the surface of the motherboard and the surface of the daughterboard, wherein the array is arranged in the predetermined pattern between the contact pads of the motherboard and the daughterboard;

additional contact pads arranged in a second pattern on a second surface of the daughterboard;

a second daughterboard having a surface, wherein the surface of the second daughterboard had contact pads arranged in the second pattern; and a second array of solder compound, positioned between the second surface of the first daughterboards and the surface of the second daughterboard between the additional contact pads of the first daughterboard and the contact pads of the second daughterboard.

2. A hybrid printed circuit board, as defined in claim 1, further comprising:

stubs, each stub comprising a conductive region having an area, underlying the contact pads on the daughterboard forming capacitive plates for the signal interconnects; and the signal interconnects having an inductance and a desired characteristic impedance;

wherein the conductive region of the stubs depends upon the inductance and the desired characteristic impedance of the signal interconnects.

3. A hybrid printed circuit board, as defined in claim 2, wherein conductive regions of the stubs on the daughterboard have equal area.

* * * * *